(12) United States Patent
Ueno

(10) Patent No.: US 12,232,265 B2
(45) Date of Patent: Feb. 18, 2025

(54) SEMICONDUCTOR STORAGE DEVICE

(71) Applicant: Kioxia Corporation, Tokyo (JP)

(72) Inventor: Koji Ueno, Toda Saitama (JP)

(73) Assignee: KIOXIA CORPORATION, Tokyo (JP)

( * ) Notice: Subject to any disclaimer, the term of this patent is extended or adjusted under 35 U.S.C. 154(b) by 196 days.

(21) Appl. No.: 17/891,368

(22) Filed: Aug. 19, 2022

(65) Prior Publication Data

US 2023/0135950 A1 May 4, 2023

(30) Foreign Application Priority Data

Nov. 4, 2021 (JP) ................................ 2021-180483

(51) Int. Cl.
| H05K 1/02 | (2006.01) |
| H05K 1/18 | (2006.01) |
| H05K 3/26 | (2006.01) |
| H05K 3/28 | (2006.01) |

(52) U.S. Cl.
CPC ... *H05K 1/181* (2013.01); *H05K 2201/09036* (2013.01); *H05K 2201/10015* (2013.01); *H05K 2201/10159* (2013.01); *H05K 2201/10522* (2013.01); *H05K 2201/10651* (2013.01)

(58) Field of Classification Search
CPC ...... H05K 1/02; H05K 1/0215; H05K 1/0203; H05K 1/0254; H05K 1/18; H05K 1/118; H05K 1/144; H05K 1/148; H05K 1/165; H05K 1/181; H05K 3/26; H05K 3/28; H05K 7/15; H05K 7/1417; H05K 7/20127; H05K 7/20436; H05K 7/20445; H05K 7/20472; H05K 7/20509; H05K 2201/09036; H05K 2201/10015; H05K 2201/10522; H05K 2201/10651
USPC ............................ 361/360, 759, 760; 29/593
See application file for complete search history.

(56) References Cited

U.S. PATENT DOCUMENTS

| 9,740,248 | B2 | 8/2017 | Sarraf et al. | |
| 2011/0156025 | A1 | 6/2011 | Shionoiri et al. | |
| 2014/0160704 | A1* | 6/2014 | Janssen ................ | H05K 7/1417 361/759 |
| 2018/0166392 | A1 | 6/2018 | Yamazaki et al. | |
| 2020/0128671 | A1* | 4/2020 | Xiang .................. | H01F 27/2804 |

(Continued)

FOREIGN PATENT DOCUMENTS

| JP | 6523136 B2 | 5/2019 |
| TW | 201140753 A | 11/2011 |
| TW | 201834197 A | 9/2018 |

*Primary Examiner* — Xiaoliang Chen
(74) *Attorney, Agent, or Firm* — Foley & Lardner LLP

(57) ABSTRACT

A semiconductor storage device includes: a printed circuit board; a nonvolatile memory disposed on the printed circuit board; a memory controller disposed on the printed circuit board and configured to operatively control the nonvolatile memory; a capacitor disposed on the printed circuit board and configured to supply power to the nonvolatile memory and the memory controller; and at least one holder that holds the capacitor at an end portion of the printed circuit board. The holder includes a connecting portion connected to the end portion of the printed circuit board, and a pair of arm portions extending from the connecting portion toward an outside of the printed circuit board and configured to sandwich a body portion of the capacitor from both sides in a thickness direction of the printed circuit board.

12 Claims, 4 Drawing Sheets

(56) References Cited

U.S. PATENT DOCUMENTS

| | | | |
|---|---|---|---|
| 2021/0015006 A1* | 1/2021 | Muto | H05K 1/181 |
| 2021/0045247 A1 | 2/2021 | Hung et al. | |
| 2022/0087072 A1* | 3/2022 | Matsuda | H05K 7/20509 |
| 2022/0304137 A1* | 9/2022 | Nagasawa | H05K 1/0203 |
| 2022/0404881 A1* | 12/2022 | Burski | H05K 1/144 |

* cited by examiner

SEMICONDUCTOR STORAGE DEVICE

CROSS-REFERENCE TO RELATED APPLICATION

This application is based upon and claims the benefit of priority from Japanese Patent Application No. 2021-180483, filed Nov. 4, 2021, the entire contents of which are incorporated herein by reference.

FIELD

Embodiments described herein relate generally to a semiconductor storage device.

BACKGROUND

A semiconductor storage device that includes a nonvolatile memory and a memory controller for controlling the nonvolatile memory can be mounted on a printed circuit board. A capacitor for supplying power to the nonvolatile memory and the memory controller may also be mounted on the same printed circuit board.

A size and a weight of the capacitor are larger than those of the nonvolatile memory and the memory controller configured as, for example, a semiconductor package. Therefore, how to mount the capacitor on the printed circuit board may raise issues.

DETAILED DESCRIPTION

Embodiments provide a semiconductor storage device in which a capacitor is mounted compactly at low cost.

In general, according to one embodiment, a semiconductor storage device includes: a printed circuit board; a nonvolatile memory disposed on the printed circuit board; a memory controller disposed on the printed circuit board and configured to operatively control the nonvolatile memory; a capacitor disposed on the printed circuit board and configured to supply power to the nonvolatile memory and the memory controller; and at least one holder that holds the capacitor at an end portion of the printed circuit board. The holder includes a connecting portion connected to the end portion of the printed circuit board, and a pair of arm portions extending from the connecting portion toward an outside of the printed circuit board and configured to sandwich a body portion of the capacitor from both sides in a thickness direction of the printed circuit board.

Hereinafter, an embodiment will be described in detail with reference to the drawings. The present disclosure is not limited to the following embodiment. Components in the following embodiment include those that can be easily conceived by those skilled in the art or those that are substantially the same.

(Functional Configuration Example of Semiconductor Storage Device)

Figure 1:
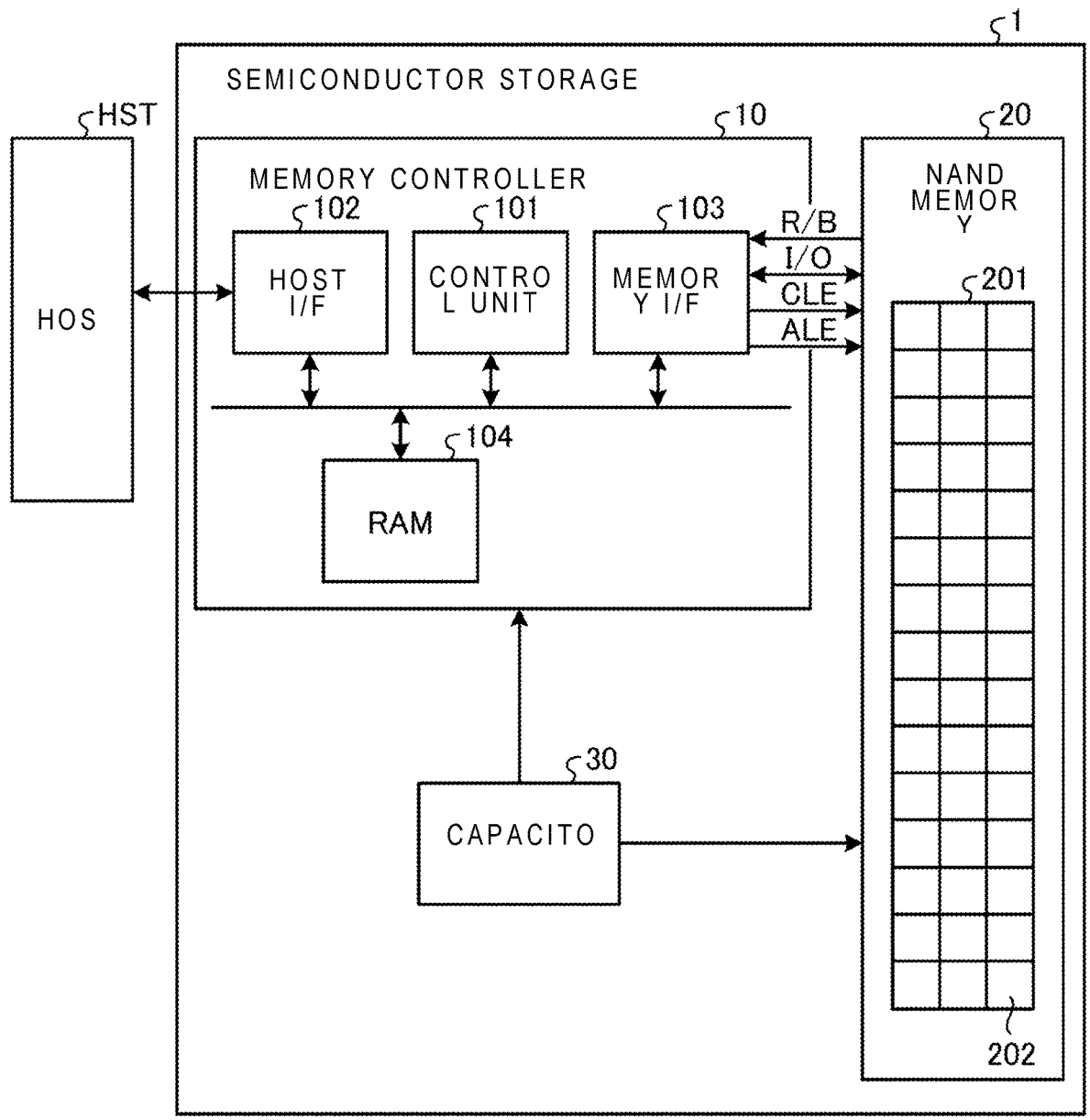
FIG. 1 is a block diagram showing an example of a functional configuration of a semiconductor storage device, which is connected to a host, according to an embodiment.

FIG. 1 is an example of a functional configuration of a semiconductor storage device 1 according to an embodiment, and is a block diagram showing the semiconductor storage device 1 connected to a host. As shown in FIG. 1, the semiconductor storage device 1 includes a memory controller 10, a nonvolatile memory 20, and a capacitor 30.

The semiconductor storage device 1 is, for example, a solid state drive (SSD) in which the memory controller 10 and the nonvolatile memory 20 are configured as one or a plurality of semiconductor packages. The semiconductor storage device 1 can be connected to a host HST. The host HST may be, for example, an information processing device such as a personal computer, a server, or a storage box. The host HST may be a mobile terminal such as a mobile phone, a tablet computer, or a smartphone. The host HST may be an imaging device or a game device. The host HST may be an in-vehicle terminal such as a car navigation system.

The nonvolatile memory 20 stores data in a nonvolatile manner. An example of the nonvolatile memory 20 is a NAND flash memory having a two-dimensional structure or a three-dimensional structure. The nonvolatile memory 20 may be a memory other than the NAND flash memory. For example, the nonvolatile memory 20 may be any of various memory media such as a NOR flash memory, a resistance random access memory (ReRAM), and a ferroelectric random access memory (FeRAM). The nonvolatile memory 20 is unnecessarily a semiconductor memory, and various memory media other than the semiconductor memory may be used. Hereinafter, the nonvolatile memory 20 is simply referred to as a NAND memory 20.

The NAND memory 20 includes a memory cell array 201. In the memory cell array 201, a plurality of memory cells are arranged in a matrix. Data from the host HST is stored in a nonvolatile manner in the individual memory cells of the memory cell array 201. The memory cell array 201 includes a plurality of blocks 202 each including a plurality of memory cells.

As described above, the block 202 is a set of nonvolatile memory cells. The number of blocks 202 in the memory cell array 201 may be any number. In the NAND memory 20, data is generally erased in units of the blocks 202, and data is written and read in units of pages.

The NAND memory 20 may include a peripheral circuit in addition to the memory cell array 201. The peripheral circuit includes, for example, a row decoder and a sense amplifier. The row decoder specifies an area of memory cells to be read and written. The sense amplifier senses data stored in memory cells to be read.

The memory controller 10 is, for example, a semiconductor integrated circuit configured as a system-on-a-chip (SoC). The memory controller 10 may be configured as a field-programmable gate array (FPGA) or an application specific integrated circuit (ASIC).

Functions of the memory controller 10 may be implemented by, for example, a processor that executes a program (firmware), a dedicated hardware circuit, or a combination thereof.

The memory controller 10 controls an operation of the NAND memory 20. That is, the memory controller 10 controls the writing of data to the NAND memory 20 according to a write request from the host HST. The memory controller 10 controls the reading of data from the NAND memory 20 according to a read request from the host HST.

To implement the above functions, the memory controller 10 includes a control unit 101, a host interface (host I/F) circuit 102, a memory interface (memory I/F) circuit 103, and a RAM 104. The control unit 101, the host I/F circuit 102, the memory I/F circuit 103, and the RAM 104 are connected to each other by an internal bus.

The host I/F circuit 102 performs processing according to an interface standard that is used to be connected with the host HST. The interface standard is, for example, serial-attached SCSI (SAS™), serial ATA (SATA™), PCI express (PCIe™) or NVM express (NVMe™). The host I/F circuit 102 outputs, to the internal bus, a request received from the host HST, data to be written (user data), and the like. The host I/F circuit 102 transmits, to the host HST, read data (user data) from the NAND memory 20, a response from the control unit 101, and the like.

The memory I/F circuit 103 exchanges various signals with the NAND memory 20 based on an instruction from the control unit 101. The signals include, for example, a ready busy signal R/B, an input/output signal I/O, a command latch enable signal CLE, or an address latch enable signal ALE. The ready busy signal R/B indicates whether the NAND memory 20 is in a state of being able to receive a command from the memory controller 10. The input/output signal I/O is data transmitted and received between the NAND memory 20 and the memory controller 10. The input/output signal I/O includes a command, an address, write data, read data, and the like. The input/output signal I/O is, for example, an 8-bit width signal. The command latch enable signal CLE notifies the NAND memory 20 that the input signal I/O is a command. The address latch enable signal ALE notifies the NAND memory 20 that the input signal I/O is an address.

By transmitting and receiving these signals, the memory I/F circuit 103 writes data to the NAND memory 20 and erases data in the NAND memory 20 based on an instruction from the control unit 101. The memory I/F circuit 103 reads data from the NAND memory 20 based on an instruction from the control unit 101.

The control unit 101 is, for example, a central processing unit (CPU). The control unit 101 operates based on firmware. For example, the firmware is stored in the NAND memory 20 at the time of the manufacture or shipment of the semiconductor storage device 1. When the semiconductor storage device 1 starts operation, the control unit 101 loads the firmware from the NAND memory 20 into the RAM 104 provided in the memory controller 10. The control unit 101 implements various functions by executing the firmware loaded into the RAM 104.

The control unit 101 integrally controls the components of the semiconductor storage device 1. When the control unit 101 receives a request from the host HST via the host I/F circuit 102, the control unit 101 performs control according to the request. For example, the control unit 101 instructs the memory I/F circuit 103 to write data to the NAND memory 20 according to a write request from the host HST. The control unit 101 instructs the memory I/F circuit 103 to read data from the NAND memory 20 according to a read request from the host HST. The control unit 101 instructs the memory I/F circuit 103 to erase data in the NAND memory 20.

The RAM 104 is, for example, a general-purpose memory such as a static random access memory (SRAM) or a dynamic random access memory (DRAM). The RAM 104 is used as, for example, a work area of the control unit 101.

The capacitor 30 is, for example, an aluminum electrolytic capacitor or a tantalum electrolytic capacitor having a metal thin film or the like as an electrode. For example, when power supplied from the outside is suddenly lost, the capacitor 30 maintains the power supplied to the memory controller 10 and the NAND memory 20, That is, the capacitor 30 functions as a power loss protection (PLP) capacitor. Thus, even when the power supplied from the outside is suddenly lost, it is possible to prevent loss of data stored in the RAM 104.

(Physical Configuration Example of Semiconductor Storage Device)

Figure 2A:
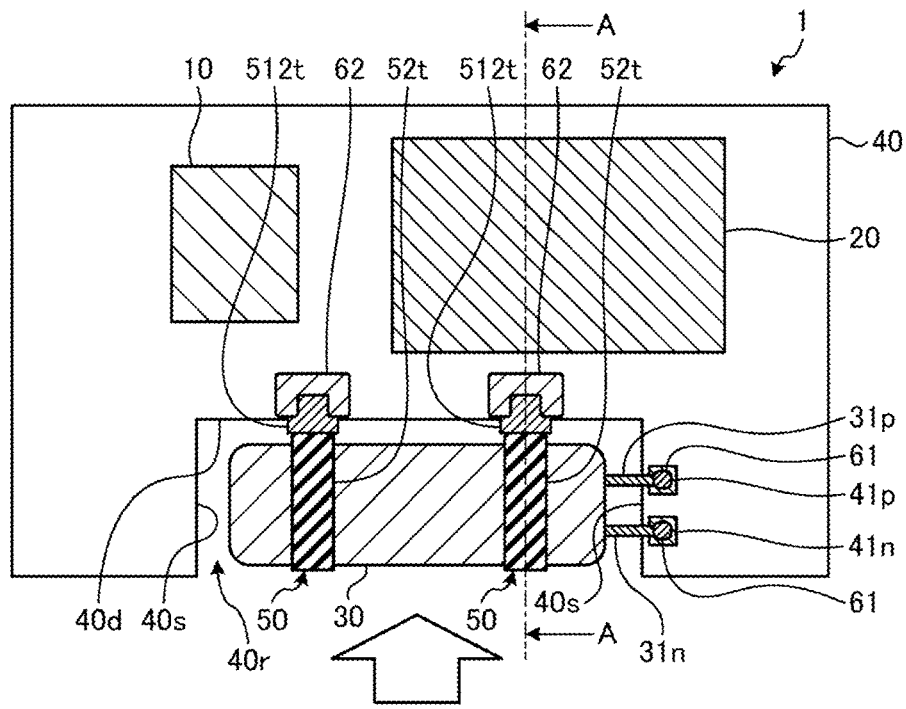
FIGS. 2A, 2B, and 2C are diagrams showing an example of a physical configuration of the semiconductor storage device according to the embodiment.
Figure 2B:
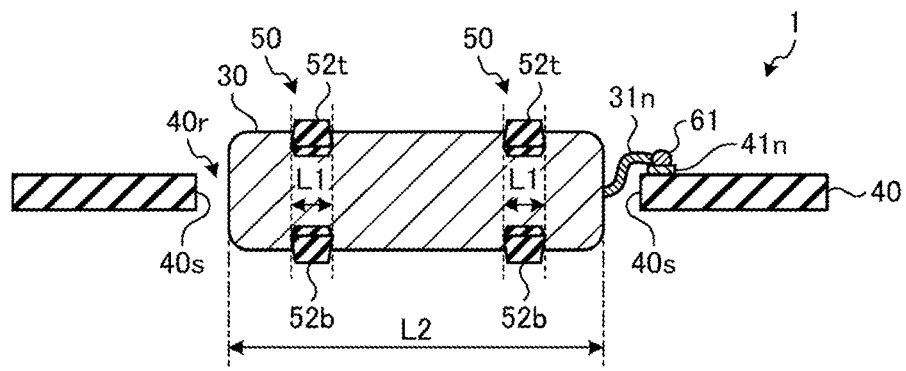
Figure 2C:
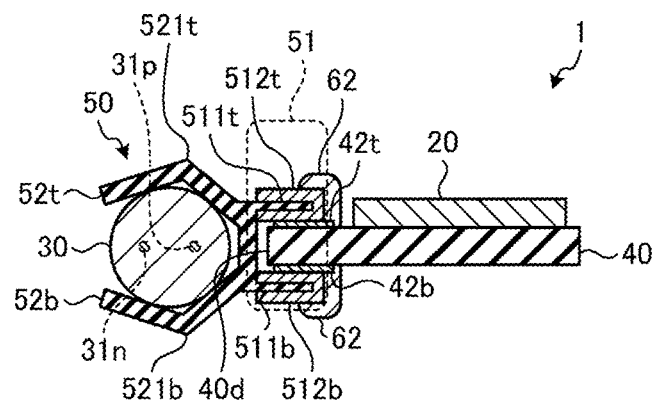

FIGS. 2A, 2B, and 2C are diagrams showing an example of a physical configuration of the semiconductor storage device 1 according to the embodiment. FIG. 2A is a top view of the semiconductor storage device 1. FIG. 2B is a side view of the semiconductor storage device 1 as viewed from a side on which the capacitor 30 is mounted (i.e., in a direction of an arrow in FIG. 2A). FIG. 2C is a cross-sectional view of the semiconductor storage device 1 as viewed from one end portion of the capacitor 30. More specifically, FIG. 2C is a cross-sectional view taken along line A-A of FIG. 2A. FIG. 2C shows, by dotted lines, lead wires 31p and 31n that are provided at the one end portion of the capacitor 30 but do not exist on the cross section.

As shown in FIG. 2A, the semiconductor storage device 1 includes the memory controller 10, the NAND memory 20, the capacitor 30, a substrate (e.g., a printed circuit board (PCB)) 40, and a plurality of holders 50.

The memory controller 10 and the NAND memory 20 are each accommodated in a semiconductor package having electrodes (not shown) and mounted on the printed circuit board 40. The electrodes of the memory controller 10 and the NAND memory 20 are electrically connected to terminals (not shown) of the printed circuit board 40, respectively.

The number of memory controllers 10 and the number of NAND memories 20 to be mounted on the printed circuit board 40 are not limited to the example of FIGS. 2A, 2B, and 2C. For example, a plurality of NAND memories 20 may be mounted on the printed circuit board 40. A plurality of memory controllers 10 may be mounted on the printed circuit board 40 so as to correspond to the NAND memories 20 in a one-to-one or many-to-one manner, for example. In this case, at least one of the memory controllers 10 and at least one of the NAND memories 20 may be mounted on both surfaces of the printed circuit board 40, respectively.

The capacitor 30 has, for example, a cylindrical shape. The positive lead wire 31p and the negative lead wire 31n protrude from the one end portion of the capacitor 30 in an extending direction. The lead wires 31p and 31n are provided separately from each other on a diameter of the end portion of the capacitor 30 having a circular shape.

However, the capacitor 30 may not have a cylindrical shape. The capacitor 30 may have, for example, an elliptic cylindrical shape or a rectangular parallelepiped shape. One of the lead wires 31p and 31n of the capacitor 30 may be provided at one end portion in the extending direction of the capacitor 30, and the other of the lead wires 31p and 31n may be provided at the other end portion in the extending direction of the capacitor 30. In this case, the lead wires 31p and 31n may be provided at the center positions of the two end portions of the capacitor 30, respectively.

In addition, the length of the capacitor 30 in the extending direction, the length of the capacitor 30 in a direction intersecting the extending direction, and the like may vary depending on a type of the capacitor 30, an amount of electric power that the capacitor 30 can store, and the like.

Hereinafter, the length of the capacitor 30 in the extending direction may be referred to as a length of a body portion of the capacitor 30, and the length of the capacitor 30 in the direction intersecting the extending direction may be referred to as a thickness of the body portion of the capacitor 30.

As will be described later, the capacitor 30 is held by the plurality of holders 50 and mounted on the printed circuit board 40.

The printed circuit board 40 is a board on which the memory controller 10, the NAND memory 20, and the capacitor 30 are mounted. The printed circuit board 40 has a substantially rectangular flat plate shape. One of the four sides of the printed circuit board 40 is provided with a recess portion 40r having a size capable of holding the capacitor 30 in a rectangular region of the printed circuit board 40.

In other words, the size of the recess portion 40r may be determined based on, for example, a size of a standard capacitor or a size of the largest capacitor among the capacitors that can be used as the capacitor 30 in the semiconductor storage device 1.

The recess portion 40r of the printed circuit board 40 has a shape formed by cutting one side (referred to as a first side) of the printed circuit board 40 in a substantially rectangular shape. The recess portion 40r includes an edge portion 40d extending in the same direction as a direction in which the first side extends at a position inside the printed circuit board 40 from the first side, and a pair of edge portions 40s extending from both ends of the edge portion 40d toward the first side. The pair of edge portions 40s face each other. One of the pair of edge portions 40s faces one end portion of the capacitor 30 from which the lead wires 31p and 31n protrude.

The shape of the recess portion 40r is not limited to the example of FIGS. 2A, 2B, and 2C as long as the capacitor 30 can be held in the rectangular region of the printed circuit board 40. For example, a corner portion where the edge portions 40d and 40s intersect may have a curved surface shape or another shape. A corner portion where the edge portion 40s and a side (first side) of the printed circuit board 40 intersect may also have a curved surface shape or another shape. In addition, the recess portion 40r itself may have various shapes.

The printed circuit board 40 includes a plurality of terminals (not shown) on a surface thereof. The plurality of terminals include terminals 41p, 41n, 42t, and 42b.

The terminals 41p and 41n are provided in the vicinity of a side facing one end portion of the capacitor 30 from which the lead wires 31p and 31n protrude, of the pair of edge portions 40s constituting the recess portion 40r. The terminals 41p and 41n are connected to the lead wires 31p and 31n of the capacitor 30 with solder balls 61, respectively.

The terminals 41p and 41n are electrically connected to the memory controller 10 and the NAND memory 20 with wires (not shown) provided on the surface of the printed circuit board 40 or provided inside the printed circuit board 40. Thus, the power from the capacitor 30 can be supplied to the memory controller 10 and the NAND memory 20.

As described above, in a case where the capacitor 30 includes the lead wires 31p and 31n at the respective two end portions, the terminal 41p is provided in the vicinity of one of the pair of edge portions 40s, and the terminal 41n is provided in the vicinity of the other of the pair of edge portions 40s. In this case, the capacitor 30 is mounted on the printed circuit board 40 such that the positions of the lead wires 31p and 31n on the two end portions of the capacitor 30 match the arrangement of the terminals 41p and 41n.

The terminals 42t and 42b are dummy terminals that are in an electrically floating state. As shown in FIG. 2C, the terminals 42t and 42b are respectively provided on both surfaces of the printed circuit board 40 in the vicinity of the edge portion 40d constituting the recess portion 40r. The terminals 42t and 42b are connected to a connecting portion 51 of the holder 50 with solder balls 62, respectively. That is, at least the same number of a plurality of pairs of terminals 42t and 42b as the number of holders 50 are arranged along the edge portion 40d of the printed circuit board 40.

Other terminals (not shown) are appropriately disposed at predetermined positions on the surface of the printed circuit board 40, and connected to, for example, electrodes (not shown) of the memory controller 10 and the NAND memory 20. Electronic components other than the memory controller 10, the NAND memory 20, and the capacitor 30 described above may be mounted on the printed circuit board 40. In this case, terminals (not shown) of the printed circuit board 40 are electrically connected to these electronic components, respectively.

A main body portion of the holder 50 is made of, for example, elastic resin. The holder 50 includes the connecting portion 51 and a pair of arm portions 52t and 52b. The main body portion of the holder 50 includes, for example, the pair of arm portions 52t and 52b, and a pair of claw portions 511t and 511b which will be described later. The main body portion of the holder 50 does not include metal covers 512t and 512b which will be described later.

The connecting portion 51 includes the pair of claw portions 511t and 511b. The pair of claw portions 511t and 511b are disposed at positions separated from each other in the thickness direction of the printed circuit board 40. The claw portion 511t protrudes from one end of the arm portion 52t. The claw portion 511b protrudes from one end of the arm portion 52b. The pair of claw portions 511t and 511b are covered with the metal covers 512t and 512b, respectively. The pair of claw portions 511t and 511b sandwich the edge portion 40d of the printed circuit board 40 from both sides in the thickness direction of the printed circuit board 40.

As described above, the metal covers 512t and 512b covering the pair of claw portions 511t and 511b are respectively connected to the terminals 42t and 42b provided on both surfaces of the printed circuit board 40 in the vicinity of the edge portion 40d with the solder balls 62. As described above, the terminals 42t and 42b of the printed circuit board 40 are in a floating state. Therefore, even if the metal covers 512t and 512b of the holder 50 are connected to the terminals 42t and 42b, the metal covers 512t and 512b do not affect the electrical characteristics of the printed circuit board 40.

The pair of arm portions 52t and 52b are disposed at positions separated from each other in the thickness direction of the printed circuit board 40. The pair of arm portions 52t and 52b extend from the connecting portion 51 toward a side opposite to the pair of claw portions 511t and 511b. That is, the pair of arm portions 52t and 52b extend from the edge portion 40d of the printed circuit board 40 toward the outside of the recess portion 40r.

As shown in FIG. 2B, a width L1 of the pair of arm portions 52t and 52b, that is, a length in a direction intersecting an extending direction of the pair of arm portions 52t and 52b and along the first side of the printed circuit board 40 is shorter than a length L2 of the body portion of the capacitor 30.

In the example of FIGS. 2A, 2B, and 2C, a width of the pair of claw portions 511t and 511b of the connecting portion 51 is also set to be substantially equal to the width L1 of the pair of arm portions 52t and 52b. However, the width of the pair of claw portions 511t and 511b may not be equal to the width L1 of the pair of arm portions 52t and 52b. For example, the width of the pair of claw portions 511t and 511b may be longer than the width L1 of the pair of arm portions 52t and 52b. Accordingly, the holder 50 can be more firmly connected to the printed circuit board 40.

As shown in FIG. 2C, the pair of arm portions 52t and 52b respectively include bent portions 521t and 521b in the vicinity of a substantially center portion in the extending direction. In the pair of arm portions 52t and 52b, a distance between the arm portions 52t and 52b in the thickness direction of the printed circuit board 40 is, for example, the maximum at the bent portions 521t and 521b.

On a side closer to the connecting portion 51 than to the bent portions 521t and 521b, the distance between the pair of arm portions 52t and 52b decreases toward the connecting portion 51. On a side farther from the connecting portion 51 than from the bent portions 521t and 521b, the distance between the pair of arm portions 52t and 52b decreases toward end portions of the pair of arm portions 52t and 52b.

Accordingly, the pair of arm portions 52t and 52b have a substantially C-shaped cross section as shown in FIG. 2C.

With such a shape, the pair of arm portions 52t and 52b sandwich the body portion of the capacitor 30 from both sides in the thickness direction of the printed circuit board 40. As described above, the arm portions 51t and 51b provided in the main body portion of the holder 50 are made of, for example, elastic resin. Therefore, the pair of arm portions 51t and 51b can hold the capacitor 30 by sandwiching the body portion of the capacitor 30 by elastic force.

The distance between the pair of arm portions 52t and 52b in the thickness direction of the printed circuit board 40 may be set based on, for example, the thickness of the body portion of a standard capacitor or the thickness of the body portion of the smallest capacitor among the capacitors that can be used as the capacitor 30 in the semiconductor storage device 1.

As long as the body portion of the capacitor 30 can be sandwiched by elastic force, the shapes of the pair of arm portions 52t and 52b are not limited to the example shown in FIGS. 2A, 2B, and 2C. In the example of FIGS. 2A, 2B, and 2C, each of the pair of arm portions 52t and 52b has substantially the same length, but one of the arm portions 52t and 52b may be longer than the other of the arm portions 52t and 52b. Further, at least one of the pair of arm portions 52t and 52b may include the plurality of bent portions 521t and 521b. Alternatively, at least one of the pair of arm portions 52t and 52b may have a smooth arc shape partially or entirely. In addition, the pair of arm portions 52t and 52b may have various shapes. The shapes of the pair of arm portions 52t and 52b may be the same or different from each other.

The plurality of holders 50 configured as described above are provided on the printed circuit board 40 at predetermined intervals along the edge portion 40d of the recess portion 40r. Thus, the capacitor 30 is held in the recess portion 40r of the printed circuit board 40 by the plurality of holders 50 such that the extending direction of the capacitor 30 is along the extending direction of the edge portion 40d.

In the example of FIGS. 2A, 2B, and 2C, two holders 50 are provided on the printed circuit board 40 to hold the capacitor 30. However, the number of holders 50 may be three or more, and may be one as long as the capacitor 30 can be reliably held.

As described above, the number of holders 50 may be appropriately selected depending on, for example, a size or a weight of the capacitor 30. Alternatively, in accordance with the length of the body portion of the largest capacitor among the capacitors that can be used as the capacitor 30 in the semiconductor storage device 1, as many holders 50 as required may be provided on the printed circuit board 40. In this case, when the capacitor 30 having a shorter body portion than the largest capacitor is held, one or more holders 50 among the plurality of holders 50 may not hold the capacitor 30.

When the capacitor 30 is held on the printed circuit board 40 as described above, the lead wires 31p and 31n at the end portion of the capacitor 30 face the edge portion 40s of the printed circuit board 40 on which the terminals 41p and 41n are provided. Accordingly, the lead wires 31p and 31n of the capacitor 30 and the terminals 41p and 41n of the printed circuit board 40 can be easily connected to each other with the solder balls 61, respectively.

Here, as shown in FIG. 2C, the holder 50 holds the capacitor 30 such that, for example, a center axis of the capacitor 30, that is, a center position in the thickness direction of the body portion of the capacitor 30, and a center position in the thickness direction of the printed circuit board 40 substantially coincide with each other in the thickness direction of the printed circuit board 40. Therefore, the lead wires 31p and 31n, which are provided on a line passing through the center position in the thickness direction of the body portion of the capacitor 30, and the terminals 41p and 41n, which are provided on the surface of the printed circuit board 40, are disposed at positions slightly shifted from each other in the thickness direction of the printed circuit board 40.

Therefore, as shown in FIG. 2B, when the lead wires 31p and 31n of the capacitor 30 are connected to the terminals 41p and 41n of the printed circuit board 40, the lead wires 31p and 31n are slightly bent in the thickness direction of the printed circuit board 40. Thus, distal end portions of the lead wires 31p and 31n are aligned with the positions of the terminals 41p and 41n in the thickness direction of the printed circuit board 40.

At this time, the lead wires 31p and 31n are preferably bent at positions as close as possible to the body portion of the capacitor 30. This enables the capacitor 30 to be mounted on the printed circuit board 40 more compactly, and the semiconductor storage device 1 can be downsized.

As described above, the plurality of holders 50 hold the capacitor 30 in the recess portion 40r of the printed circuit board 40. The lead wires 31p and 31n of the capacitor 30 are connected to the terminals 41p and 41n of the printed circuit board 40, so that the capacitor 30 is mounted on the printed circuit board 40.

That is, when mounting the capacitor 30 on the printed circuit board 40, the plurality of holders 50 are soldered to the printed circuit board 40 in advance. After the capacitor 30 is mounted so as to be sandwiched between the arm portions 52t and 52b of the holders 50, the lead wires 31p and 31n of the capacitor 30 are soldered to the terminals 41p and 41n of the printed circuit board 40, respectively.

The holder 50 can be manufactured by injection molding using a mold, for example. That is, a manufacturer prepares a mold having a cavity of the shape of the main body portion of the holder 50. Then, the manufacturer injects resin into the cavity of the mold and solidifies the resin.

Meanwhile, the manufacturer manufactures the metal cover 512t having an insertion hole for the claw portion 511t and the metal cover 512b having an insertion hole for the claw portion 511b, and inserts the claw portions 511t and 511b into the metal covers 512t and 512b, respectively. The claw portions 511t and 511b may have the same shape. In this case, the manufacturer can manufacture a pair of metal covers having the same shape, and can fit one of the metal covers into the claw portion 511t and fit the other of the metal covers into the claw portion 511b.

As described above, the manufacturer can manufacture the holder 50 of the embodiment.

Comparative Example

In a semiconductor storage device according to a comparative example, a dedicated socket corresponding to a size of a capacitor is attached onto a surface of a printed circuit board, and the capacitor is mounted in a state of being laid down on the socket. The socket has, for example, a recess portion larger than the body portion of the capacitor, and a terminal is provided on a side wall on one end portion of the recess portion. When the capacitor is fitted into the recess portion of the socket, a lead wire of the capacitor and the terminal of the socket are connected to each other.

However, in the configuration according to the comparative example, it is necessary to manufacture a socket for each capacitor in accordance with the size of the capacitor, which increases the cost of the semiconductor storage device. Since the capacitor is mounted on the printed circuit board in a state of being laid down horizontally, an area for mounting various electronic components on the printed circuit board is reduced. A degree of freedom in the arrangement of these electronic components on the printed circuit board is also limited.

According to the semiconductor storage device 1 of the embodiment, the holder 50 includes the pair of arm portions 52t and 52b that extend from the connecting portion 51 connected to an end portion of the printed circuit board 40 toward the outside of the printed circuit board 40 and sandwich the body portion of the capacitor 30 from both sides in the thickness direction of the printed circuit board 40 by elastic force.

Since the holder 50 sandwiches and holds the capacitor 30 from both sides in the thickness direction of the printed circuit board 40, the holder 50 can hold various capacitors 30 having different lengths of the body portion. Since the holder 50 sandwiches and holds the capacitor 30 by elastic force, the holder 50 can also hold various capacitors 30 having different thicknesses of the body portion. Accordingly, it is not necessary to manufacture different holders 50 for each capacitor 30, and the capacitor 30 can be mounted on the printed circuit board 40 at low cost.

The holder 50 holds the capacitor 30 on an outer side deviated from the surface of the printed circuit board 40. Therefore, for example, compared to a case where the capacitor 30 is mounted on the surface of the printed circuit board 40, it is possible to prevent a reduction in an area for mounting various electronic components on the printed circuit board 40. That is, it is possible to improve the degree of freedom in the arrangement of various electronic components on the printed circuit board 40.

As described above, with the holders 50 of the embodiment, the capacitor 30 can be mounted compactly on the printed circuit board 40 at low cost.

According to the semiconductor storage device 1 of the embodiment, the printed circuit board 40 includes the recess portion 40r. The capacitor 30 is held with the holders 50 connected to the edge portion 40d located on an inner side with respect to one side of the printed circuit board 40, and is disposed in the recess portion 40r of the printed circuit board 40.

Accordingly, an increase in an area of the entire printed circuit board 40 due to the mounting of the capacitor 30 is prevented. Therefore, it is easy to downsize the semiconductor storage device 1. For example, as compared with a case where the capacitor 30 is mounted so as to protrude from the rectangular region of the printed circuit board 40, the risk of vibration and impact being applied to the capacitor 30 is reduced, and the capacitor 30 can be stably held on the printed circuit board 40.

According to the semiconductor storage device 1 of the embodiment, the lead wires 31p and 31n of the capacitor 30 are respectively connected to the terminals 41p and 41n disposed on the surface of the printed circuit board 40 in the vicinity of the edge portion 40s facing the end portion of the capacitor 30. Accordingly, a connection distance between the lead wires 31p and 31n and the terminals 41p and 41n can be shortened, and the capacitor 30 can be mounted on the printed circuit board 40 more compactly.

According to the semiconductor storage device 1 of the embodiment, the width of the pair of arm portions 52t and 52b is shorter than the length of the capacitor 30 in the extending direction. The printed circuit board 40 is provided with the plurality of holders 50 at the end portion of the printed circuit board 40 so that the plurality of holders 50 are arranged in the extending direction of the capacitor 30.

Accordingly, the number of holders 50 and an interval between the holders 50 can be adjusted in accordance with the length of the body portion of the capacitor 30, which makes it easier to cope with capacitors of various sizes. By adjusting the number of holders 50 and the interval between the holders 50, the capacitor 30 can be held more firmly and stably.

According to the semiconductor storage device 1 of the embodiment, the holder 50 includes the pair of claw portions 511t and 511b that sandwich the printed circuit board 40 from both sides in the thickness direction of the printed circuit board 40. The pair of claw portions 511t and 511b sandwich and connect the printed circuit board 40 from both sides in the thickness direction, so that the holder 50 can be more firmly fixed to the printed circuit board 40.

According to the semiconductor storage device 1 of the embodiment, the pair of claw portions 511t and 511b are covered with the metal covers 512t and 512b, and are connected to the end portion of the printed circuit board 40 with the solder balls 62. Thus, by providing the metal covers 512t and 512b, the pair of claw portions 511t and 511b can be connected to the dummy terminals 42t and 42b of the printed circuit board 40 with the solder balls 62. Thus, the holder 50 can be more firmly fixed to the printed circuit board 40.

In the semiconductor storage device 1 of the above embodiment, the connecting portion 51 of the holder 50 is connected to the end portion of the printed circuit board 40 with the solder balls 62. However, the connecting portion 51 may be connected to the end portion of the printed circuit board 40 with an adhesive or the like. In this case, the holder 50 may not include the metal covers 512t and 512b, and the pair of claw portions 511t and 511b may be directly connected to the printed circuit board 40 with the adhesive. In this case, the dummy terminals 42t and 42b of the printed circuit board 40 may not be provided.

(First Modification)

Next, a semiconductor storage device 2 according to a first modification of the embodiment will be described with reference to FIGS. 3A and 3B. In the semiconductor storage device 2 of the first modification, a holding position of the capacitor 30 with respect to the printed circuit board 40 is different from that of the semiconductor storage device 1 of the above embodiment.

Figure 3A:
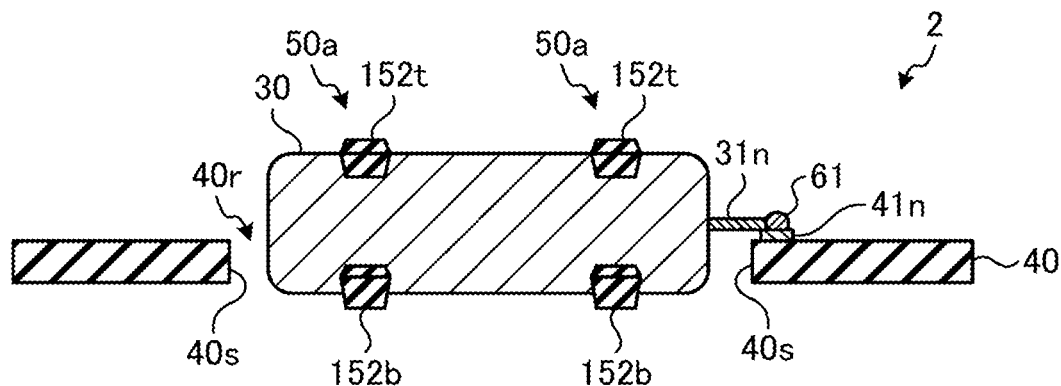
FIGS. 3A and 3B are diagrams showing an example of a physical configuration of a semiconductor storage device according to a first modification of the embodiment.
Figure 3B:
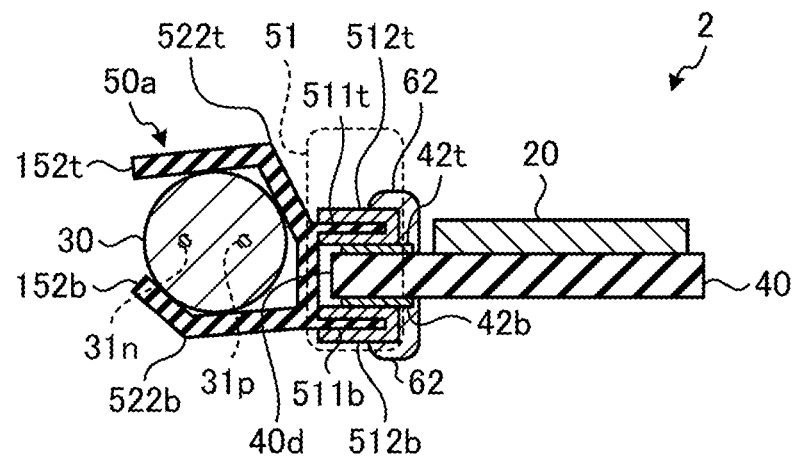

FIGS. 3A and 3B are diagrams showing an example of a physical configuration of the semiconductor storage device 2 according to the first modification of the embodiment. FIG. 3A is a side view of the semiconductor storage device 2 as viewed from a side on which the capacitor 30 is mounted, and is a diagram corresponding to FIG. 2B of the above embodiment. FIG. 3B is a cross-sectional view of the semiconductor storage device 2 as viewed from one end portion side of the capacitor 30, and is a diagram corresponding to FIG. 2C of the above embodiment. In FIGS. 3A and 3B, the same components as those of the above embodiment are denoted by the same reference numerals, and the description thereof may be omitted.

As shown in FIGS. 3A and 3B, holders 50a provided in the semiconductor storage device 2 of the first modification include arm portions 152t and 152b having shapes different from those of the arm portions 52t and 52b of the holder 50 of the above embodiment. That is, the pair of arm portions 152t and 152b extend from the edge portion 40d of the printed circuit board 40 toward the outside of the recess portion 40r at an angle different from that of the arm portions 52t and 52b of the embodiment. Hereinafter, the difference in shape will be described in more detail.

The arm portion 152t includes a bent portion 522t in the vicinity of a substantially center portion in the extending direction. The inclination from the connecting portion 51 to the bent portion 522t with respect to the surface of the printed circuit board 40 is steeper than the inclination of the arm portion 52t from the connecting portion 51 to the bent portion 521t. Accordingly, the bent portion 522t of the arm portion 152t is located at a position farther from the center position in the thickness direction of the printed circuit board 40 (i.e., at a position shifted upward in the drawing) than the bent portion 521t of the arm portion 52t is.

The arm portion 152b includes a bent portion 522b in the vicinity of a substantially center portion in the extending direction. The inclination from the connecting portion 51 to the bent portion 522b with respect to the surface of the printed circuit board 40 is gentler than the inclination of the arm portion 52b from the connecting portion 51 to the bent portion 521b. Accordingly, the bent portion 522b of the arm portion 152b is located at a position closer to the center position in the thickness direction of the printed circuit board 40 (i.e., at a position shifted upward in the drawing) than the bent portion 521b of the arm portion 52b is.

Since the pair of arm portions 152t and 152b have such a shape, the holders 50a of the first modification hold, in the thickness direction of the printed circuit board 40, the capacitor 30 in a state where the center position in the thickness direction of the body portion of the capacitor 30 and the center position in the thickness direction of the printed circuit board 40 are shifted from each other.

More specifically, the center position in the thickness direction of the body portion of the capacitor 30 is disposed at a position shifted from the center position in the thickness direction of the printed circuit board 40 toward the surface of the printed circuit board 40 on which the terminals 41p, 41n, and 42t are mounted. Thus, the center position in the thickness direction of the body portion of the capacitor 30 is disposed at a position substantially aligned with the terminals 41p and 41n in the thickness direction of the printed circuit board 40.

As described above, the lead wires 31p and 31n are provided at an end portion of the capacitor 30, for example, on a line passing through the center position in the thickness direction of the body portion of the capacitor 30. Accordingly, the lead wires 31p and 31n are also disposed at positions substantially aligned with the terminals 41p and 41n in the thickness direction of the printed circuit board 40.

Therefore, in the semiconductor storage device 2 of the first modification, the lead wires 31p and 31n of the capacitor 30 can be connected to the terminals 41p and 41n of the printed circuit board 40 while maintaining a substantially linear state without being bent.

In the holder 50a of the first modification, a plurality of bent portions 522t and 522b may be provided, and the shapes of the pair of arm portions 152t and 152b may be made different in various ways, such as an arc shape.

In the example of FIGS. 3A and 3B, the arm portion 152b is shorter than the arm portion 152t. Accordingly, distances from the end portion of the printed circuit board 40 to the respective distal end portions of the arm portions 152t and 152b are substantially equal to each other in the protruding direction of the arm portions 152t and 152b, that is, in a direction along the surface of the printed circuit board 40. However, for example, lengths of the arm portions 152t and 152b may be equal to each other. That is, the distal end portion of one of the arm portions 152t and 152b may protrude from the distal end portion of the other of the arm portions 152t and 152b. Even in this case, it is preferable that both the distal end portions of the arm portions 152t and 152b are accommodated in the recess portion 40r of the printed circuit board 40.

According to the semiconductor storage device 2 of the first modification, the holders 50a hold the capacitor 30 at a position where the lead wires 31p and 31n of the capacitor 30 and the terminals 41p and 41n of the printed circuit board 40 are aligned in the thickness direction of the printed circuit board 40.

Accordingly, when the capacitor 30 is mounted on the printed circuit board 40, the lead wires 31p and 31n do not need to be bent. Therefore, manufacturing processes of the semiconductor storage device 2 can be reduced, the time required for manufacturing can be shortened, and manufacturing costs can be reduced.

Since the capacitor 30 is mounted on the printed circuit board 40 while the lead wires 31p and 31n are substantially linear, for example, it is possible to reduce loads on the lead wires 31p and 31n due to bending. Accordingly, for example, it is possible to prevent a gap from being formed at joint portions between the lead wires 31p and 31n and the body portion of the capacitor 30, and to prevent moisture or the like from entering the capacitor 30 through such a gap.

According to the semiconductor storage device 2 of the first modification, effects similar to those of the semiconductor storage device 1 of the above embodiment can be obtained.

(Second Modification)

Next, a semiconductor storage device 3 according to a second modification of the embodiment will be described with reference to FIGS. 4A and 4B. In the semiconductor storage device 3 of the second modification, the structure of a connecting portion 151 of a holder 50b is different from that of the semiconductor storage device 1 of the above embodiment.

Figure 4A:
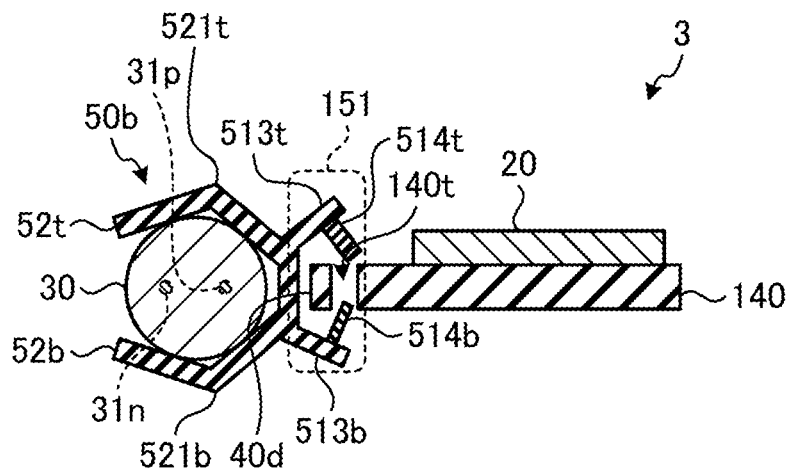
FIGS. 4A and 4B are diagrams showing an example of a physical configuration of a semiconductor storage device according to a second modification of the embodiment.
Figure 4B:
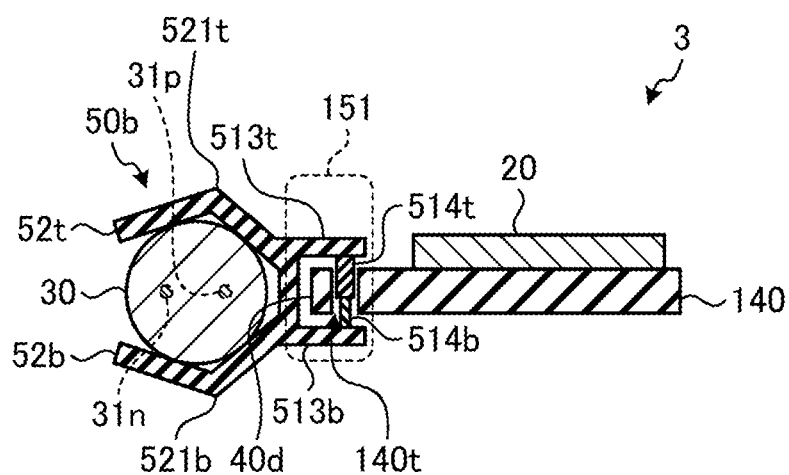

FIGS. 4A and 4B are diagrams showing an example of a physical configuration of the semiconductor storage device 3 according to the second modification of the embodiment. More specifically, FIGS. 4A and 4B are cross-sectional views of the semiconductor storage device 3 as viewed from one end portion of the capacitor 30, and are diagrams corresponding to FIG. 2C of the above embodiment. FIG. 4A shows a state in which press-contact connectors 514*t* and 514*b* of the holder 50*b* are released, and FIG. 4B shows a state in which the press-contact connectors 514*t* and 514*b* are press-contacted. In FIGS. 4A and 4B, the same components as those of the above embodiment are denoted by the same reference numerals, and the description thereof may be omitted.

As shown in FIGS. 4A and 4B, the holder 50*b* of the second modification includes the connecting portion 151 including a pair of claw portions 513*t* and 513*b* and the press-contact connectors 514*t* and 514*b*. These portions are all made of, for example, resin, and the connecting portion 151 does not include the metal covers 512*t* and 512*b* as in the holder 50 of the above embodiment. Accordingly, the entire holder 50*b* of the second modification is made of, for example, resin.

The pair of claw portions 513*t* and 513*b* protrude toward the printed circuit board 140 at positions separated from each other in the thickness direction of the printed circuit board 140. The press-contact connector 514*t* is provided in the vicinity of a distal end portion of the claw portion 513*t* so as to protrude from a surface of the claw portion 513*t* facing the printed circuit board 140. The press-contact connector 514*b* is provided in the vicinity of a distal end portion of the claw portion 513*b* so as to protrude from a surface of the claw portion 513*b* facing the printed circuit board 140.

That is, the press-contact connectors 514*t* and 514*b* are disposed to face each other with the printed circuit board 140 interposed therebetween. The press-contact connectors 514*t* and 514*b* mesh with each other by being fastened with pliers or the like. Of the press-contact connectors 514*t* and 514*b*, the press-contact connector 514*t* is a receiving connector, and the press-contact connector 514*b* is an inserting connector.

However, the arrangement of the press-contact connectors 514*t* and 514*b* may be reversed. For example, the inserting press-contact connector may be provided in the claw portion 513*t*, and the receiving press-contact connector may be provided in the claw portion 513*b*.

The printed circuit board 140 of the second modification includes a through hole 140*t* in the vicinity of the edge portion 40*d*. The printed circuit board 140 may not include the terminals 42*t* and 42*b* in the vicinity of the edge portion 40*d*.

When the holder 50*b* is connected to the printed circuit board 140, as shown in FIG. 4A, the pair of claw portions 513*t* and 513*b* of the connecting portion 151 are disposed to sandwich the printed circuit board 140 from both sides in the thickness direction. As shown in FIG. 4B, the press-contact connectors 514*t* and 514*b* are inserted into the through hole 140*t* of the printed circuit board 140 from both sides in the thickness direction of the printed circuit board 140, and the press-contact connector 514*b* is fitted into the press-contact connector 514*t*.

As described above, the holder 50*b* of the second modification is pressed against the printed circuit board 140 by the press-contact connectors 514*t* and 514*b*.

According to the semiconductor storage device 3 of the second modification, the pair of claw portions 513*t* and 513*b* are pressed against an end portion of the printed circuit board 140. By configuring the holder 50*b* in this manner, the holder 50*b* can be easily connected to the printed circuit board 140 without undergoing a process such as soldering or the like. Since soldering or the like is not performed, the holder 50*b* can be easily detached from the printed circuit board 140 when the holder 50*b* is replaced.

According to the semiconductor storage device 3 of the second modification, effects similar to those of the semiconductor storage device 1 of the above embodiment can be obtained.

In the semiconductor storage device 3 of the second modification, the holder 50*b* may be configured to hold the capacitor 30 at a position slightly shifted from the center position in the thickness direction of the printed circuit board 140 as the holder 50*a* of the first modification.

In the semiconductor storage devices 1 to 3 of the above embodiment and the first and second modifications, the main body portions of the holders 50, 50*a*, and 50*b* are made of, for example, resin. However, a main body portion of a holder, that is, a pair of claw portions, a pair of arm portions, and the like may be made of, for example, elastic metal.

When the main body portion of the holder is made of metal, the holder can be connected to a printed circuit board by soldering even if the pair of claw portions of the holder do not include metal covers as in the embodiment and the first modification. That is, the metal claw portions can be directly soldered to terminals of the printed circuit board. However, even if the main body portion of the holder is made of metal, the claw portions may be connected to the printed circuit board with adhesive or the like.

As described above, the metal holder can also be connected to the printed circuit board by soldering or pressure contacting, or with adhesive.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a printed circuit board including a recess portion located on a first side of the printed circuit board and a terminal; and
   at least one holder configured to hold a capacitor at an end portion of the printed circuit board, the capacitor being configured to supply power to a nonvolatile memory and a memory controller that is operatively coupled to the nonvolatile memory, the capacitor including a lead wire extending along a surface of the printed circuit board and extending from an end portion of the capacitor in an extending direction, the lead wire is connected to the terminal disposed on the surface of the printed circuit board, wherein
   the recess portion includes a first edge portion to which the holder is connected, and the recess portion includes a second edge portion extending from the first edge portion toward the first side,
   the holder includes:
      a connecting portion connected to the end portion of the printed circuit board; and
      a pair of arm portions extending from the connecting portion toward an outside of the printed circuit board and configured to sandwich a body portion of the capacitor from both top and bottom sides of the printed circuit board, the holder is configured to hold the capacitor in the recess portion, and the end portion faces the second edge portion.

2. The semiconductor storage device according to claim 1, wherein the holder holds the capacitor at a position where the lead wire and the terminal are aligned in the thickness direction of the printed circuit board.

3. The semiconductor storage device according to claim 2, wherein the lead wire is disposed on a line passing through a center position in a direction intersecting the extending direction of the capacitor, and the holder holds the capacitor in a state where the center position of the capacitor and a center position in the thickness direction of the printed circuit board are shifted from each other in the thickness direction of the printed circuit board.

4. The semiconductor storage device according to claim 3, wherein the pair of arm portions include:
 a first arm portion; and
 a second arm portion having a length different from that of the first arm portion.

5. The semiconductor storage device according to claim 1, wherein at least the arm portion of the holder is made of elastic metal, and the arm portion of the holder sandwiches the body portion of the capacitor by elastic force.

6. The semiconductor storage device according to claim 5, wherein at least the connecting portion of the holder is made of metal, the connecting portion includes a pair of claw portions sandwiching the printed circuit board from both sides in the thickness direction of the printed circuit board, and the pair of claw portions are connected to the end portion of the printed circuit board by soldering, pressure contacting, or with adhesive.

7. The semiconductor storage device according to claim 1, wherein a width of the pair of arm portions is shorter than a length of the capacitor in the extending direction.

8. The semiconductor storage device according to claim 7, wherein the at least one holder includes a plurality of the holders, and the plurality of holders are arranged in the extending direction of the capacitor and connected to the end portion of the printed circuit board.

9. A semiconductor storage device comprising
a printed circuit board; and
at least one holder configured to hold a capacitor at an end portion of the printed circuit board, the capacitor being configured to supply power to a nonvolatile memory and a memory controller that is operatively coupled to the nonvolatile memory, wherein the holder includes:
 a connecting portion connected to the end portion of the printed circuit board; and
 a pair of arm portions extending from the connecting portion toward an outside of the printed circuit board and configured to sandwich a body portion of the capacitor from both top and bottom sides of the printed circuit board, at least the arm portion of the holder is made of elastic resin, the arm portion of the holder sandwiches the body portion of the capacitor by elastic force, and the connecting portion further includes a pair of claw portions sandwiching the printed circuit board from both sides in the thickness direction of the printed circuit board.

10. The semiconductor storage device according to claim 9, wherein the pair of claw portions are covered with a metal cover, and are connected to the end portion of the printed circuit board by soldering in the metal cover.

11. The semiconductor storage device according to claim 9, wherein the pair of claw portions are pressed against the end portion of the printed circuit board.

12. The semiconductor storage device according to claim 9, wherein the pair of claw portions are connected to the end portion of the printed circuit board with adhesive.

* * * * *